US 6,558,500 B2

(12) United States Patent
Matsuura et al.

(10) Patent No.: US 6,558,500 B2
(45) Date of Patent: *May 6, 2003

(54) METHOD OF PRODUCING A LEAD FRAME WITH COMPOSITE FILM ATTACHED, AND USE OF THE LEAD FRAME

(75) Inventors: Hidekazu Matsuura, Oyama (JP); Yoshihiro Nomura, Ichihara (JP)

(73) Assignee: Hitachi Chemical Company, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/932,098

(22) Filed: Aug. 20, 2001

(65) Prior Publication Data

US 2002/0007905 A1 Jan. 24, 2002

Related U.S. Application Data

(62) Division of application No. 09/421,002, filed on Oct. 20, 1999, now Pat. No. 6,302,991, which is a division of application No. 08/844,430, filed on Apr. 18, 1997, now Pat. No. 5,998,020.

(30) Foreign Application Priority Data

Apr. 19, 1996 (JP) .............................................. 8-098027

(51) Int. Cl.⁷ ............................ B32B 31/26; B32B 7/12; H01L 23/50
(52) U.S. Cl. ................. 156/261; 156/309.9; 156/330.9; 428/346; 257/666; 257/675; 257/690; 257/706
(58) Field of Search ................................ 156/261, 325, 156/309.9, 327, 330.9; 428/346; 257/666, 675, 676, 678, 690, 706

(56) References Cited

U.S. PATENT DOCUMENTS

| 4,289,568 A | 9/1981 | Trotsky et al. .......... 156/261 X |
| 4,581,096 A | 4/1986 | Sato ........................ 156/261 X |
| 5,032,438 A | 7/1991 | Sakumoto et al. .......... 428/41.8 |
| 5,091,251 A | 2/1992 | Sakumoto et al. .......... 428/41.1 |
| 5,277,972 A | 1/1994 | Sakumoto et al. ....... 428/343 X |
| 5,406,124 A | 4/1995 | Morita et al. |
| 5,507,910 A | 4/1996 | Miyajima ................ 156/216 X |
| 5,510,189 A | 4/1996 | Sakumoto et al. ....... 428/343 X |
| 5,593,774 A | 1/1997 | Hiroe et al. ................. 428/343 |
| 5,635,009 A | 6/1997 | Kawamura et al. ......... 156/261 |
| 5,723,899 A * | 3/1998 | Shin |
| 5,959,068 A | 9/1999 | Oka et al. ............ 156/330.9 X |
| 5,998,020 A * | 12/1999 | Matsuura et al. |
| 6,025,212 A | 2/2000 | VanNortwick et al. |
| 6,252,033 B1 * | 6/2001 | Kweon et al. |
| RE37,323 E * | 8/2001 | Kawamura et al. |
| 6,302,991 B1 * | 10/2001 | Matsuura et al. ........... 156/261 |
| 6,372,080 B1 * | 4/2002 | Matsuura et al. |

FOREIGN PATENT DOCUMENTS

| EP | 0 618 614 | * 10/1994 |
| JP | 02-036542 | 2/1990 |
| JP | 3-64386 | 3/1991 |
| JP | 04006892 A | 1/1992 |
| JP | 04044347 A | 2/1992 |
| JP | 6-334110 | 12/1994 |
| JP | 07252459 A | 10/1995 |

OTHER PUBLICATIONS

"Polyester Films for Electrical Purposes" *JIS C 2318* (1975), pp. 2097–2109.

UBE Industries, Polyimide Film/Summary of Properties, UPILEX–S, Document No. 19622000820.

* cited by examiner

Primary Examiner—Curtis Mayes
(74) Attorney, Agent, or Firm—Antonelli, Terry, Stout & Kraus, LLP

(57) ABSTRACT

Disclosed is a composite film, a method of producing a lead frame with the composite film attached, and a method of bonding a semiconductor chip to this lead frame having the composite film attached. The composite film includes a base film and an adhesive layer on one or both sides of the base film. The composite film has a thickness of T ($\mu m$), the base film has an edge tearing strength of R (kg/20 mm), the adhesive layer has a total thickness of A, and the base film has a thickness of B, T being related to R by a numerical formula $R > 0.6T-8$ when $T \leq 60$, or by a numerical formula $R \geq 28$ when $T > 60$, and $A/B$ being 0.5 to 1.4.

40 Claims, No Drawings

METHOD OF PRODUCING A LEAD FRAME WITH COMPOSITE FILM ATTACHED, AND USE OF THE LEAD FRAME

This application is a Divisional application of prior application Ser. No. 09/421,002, filed Oct. 20, 1999, now U.S. Pat. No. 6,302,991, which is a Divisional application of prior application Ser. No. 08/844,430, filed Apr. 18, 1997 now U.S. Pat. No. 5,998,020.

BACKGROUND OF THE INVENTION (a) Field of the Invention

The present invention relates to a composite film which has excellent punching capability and is useful as a bonding element for semiconductor packaging.

(b) Description of Related Art

In semiconductor packaging, a bonding element which is a composite film produced by coating one or both sides of a base film with adhesives is used for bonding chips to lead frames to form LOC (lead on chip) or COL (chip on lead) structures or window-tub structures, or for bonding inner leads to heat spreaders to form composite lead frames with heat sinks attached. The bonding element is generally applied to the lead frames by punching out the bonding element from the composite film over the lead frames and pressing the bonding elements to required parts of the lead frames. However, the yield rate of the resulting lead frames with composite film attached is low since flashes are frequently formed at the punched edges of the composite film.

SUMMARY OF THE INVENTION

An object of the present invention is to provide a composite film which is so excellent in punching capability as not to form flashes at the time of punching and are useful as bonding film in semiconductor packaging.

Another object of the present invention is to provide a lead frame with composite film bonded to the required parts of the lead frame by punching the composite film of the present invention and is reliable when used in semiconductor packages.

As a result of studies in the relationship between the properties of composite film and flashes, we have found that flashing can be effectively prevented when there exists specific relation between the thickness T of composite film and the edge tearing strength R and have completed the present invention based on the finding.

That is, the present invention provides a composite film, comprising a base film and an adhesive layer on at least one side of the base film, the composite film having a thickness of T ($\mu$m), the base film having an edge tearing strength of R (kg/20 mm), the adhesive layer having a total thickness of A, the base film having a thickness of B, T being related to R by a numerical formula R>0.6T-8 when T$\leq$60, or by a numerical formula R$\geq$28 when T>60, and A/B being 0.5 to 1.4.

The present invention further provides a lead frame with a composite film attached, comprising a lead frame body and a composite film applied to the lead frame body, the composite film being punched out from the composite film of the present invention.

The present invention further provides a method of producing a lead frame with a composite film attached, comprising punching out a composite film from the composite film of the present invention, pressing the punched out composite film to a lead frame body, with one adhesive layer contacting a surface of the lead frame body.

Herein, the edge tearing strength of base film is measured according to JIS C 2318.

Flashes, which tend to be formed at the edges of punched composite film comprising a base film and an adhesive layer on at least one side of the base film, can be extremely decreased by using a composite film wherein T and R are related to each other by the above numerical formula and the ratio of the thickness A of the adhesive layer to the thickness B of the base film, A/B, is within the above-described range.

THE PREFERRED EMBODIMENTS OF THE INVENTION

The composite film of the present invention is produced by applying adhesives to one or both sides of a base film, followed by drying. The adhesives applied to both sides of the base film may be identical with or different from each other.

The desirable adhesives are heat resistant adhesives which contain as main components heat resistant thermoplastic resins and have a glass transition temperature (Tg) of 150 to 350° C., a water absorption of 3% or less and a broadening length of 2 mm or less, and, therefore, polyimide adhesives and polyamide adhesives are suitable.

Herein, the term "polyimide" means not only polyimide but also any other resin containing imide bonds, such as polyamideimide, polyesterimide or polyetherimide.

If the glass transition temperature is beyond the above-described range, or the water absorption is more than 3% by weight, or the broadening length is longer than 2 mm, the resistance to reflow cracking of packages tends to be decreased.

The water absorption of the heat resistant adhesives is more preferably 2.5% by weight or less, particularly preferably 2.0% by weight or less. The broadening length is more preferably 1 mm or less, particularly preferably 0.5 mm or less.

In addition, fillers, such as ceramic powder, glass powder, silver powder, copper powder, resin powder, gum powder and coupling agents may also be added to the heat resistant adhesives. The heat resistant adhesives may also be used after impregnating with it a base sheet, such as glass fabric, aramid fabric or carbon fiber fabric.

Usable examples of the coupling agents include; vinylsilanes, such as vinyltriethoxysilane, vinyltrimethoxysilane and γ-methacryloxy-propyltrimethoxysilane; epoxysilanes, such as γ-glycidoxypropyltrimethoxysilane, γ-glycidoxypropylmethyldiethoxysilane and β-(3,4-epoxycyclohexyl)ethyltrimethoxysilane; aminosilanes, such as γ-aminopropyltriethoxysilane, γ-aminopropyltrimethoxysilane and N-phenyl-γ-aminopropyltrimethoxysilane; mercaptosilanes, such as γ-mercaptopropyltrimethoxysilane; and coupling agents such as titanates, aluminum chelates and zircoaluminates.

Of these, silane coupling agents are preferred with epoxysilane coupling agents being particularly preferred.

Herein, "broadening length of an adhesive" defines a width by which a film of the adhesive of 19×50 mm and 25 μm thick is broadened out perpendicularly from the middle of each side of the film by pressing the film at 350° C. at 3 MPa for one minute.

The base film to be used in the present invention, preferably, is a heat resistant film made of an engineering plastic, such as polyimide, polyamide, polysulfone, polyphenylenesulfide, polyetheretherketone or polyarylate. The thickness of the base film is preferably 5 to 150 μm, more preferably 20 to 125 μm.

The glass transition temperature (Tg) of the heat resistant film is preferably higher than the Tg of the adhesives to be used in the present invention, and is preferably 200° C. or higher, more preferably 250° C. or higher. The heat resistant film preferably has a water absorption of 3% by weight or less, more preferably 2% by weight or less.

Therefore, polyimide film is suitable as the base film to be used in the present invention because of the high Tg, the low water absorption and the low thermal expansion coefficient thereof. The particularly preferred film has a Tg of 250° C. or higher, a water absorption of 2% by weight or less and a thermal expansion coefficient of $3 \times 10^{-5}/°$ C. or less.

To increase the adhesion force between the base film and the adhesives, it is preferable to surface treating the base film. The surface treatments applicable in the present invention are not limited and include, for example, chemical treatment, such as alkali treatment and silane coupling agent treatment, physical treatment, such as sand blasting, plasma treatment or corona treatment, and it is possible to select one or more treatments that are the most suitable for the adhesives used. In cases where heat resistant film is used as the base film and adhesive layers of heat resistant adhesive are applied thereto, chemical treatment or plasma treatment is particularly suitable.

The method of forming the adhesive layers on the base film is not particularly limited, and an example of suitable methods comprises applying adhesive varnish to the base film and drying to remove solvents. The method of applying the adhesive varnish to the base film is not particularly limited, and may be any one using a doctor blade, a knife coater or a dye coater. The application may also be performed by dipping the base film in adhesive varnish, but it may be difficult to control the thickness of the adhesive layers.

For example, the adhesive varnish may be a varnish of a heat resistant resin, such as a heat resistant thermoplastic resin, or a heat resistant adhesive comprising mainly of a heat resistant resin, dissolved in solvents. Alternatively the adhesive varnish may be a varnish of a heat resistant resin precursor which can be converted into a heat resistant resin by heat treatment or the like following to coating, or an adhesive composition comprising mainly of the precursor, dissolved in solvents. Examples of the precursors are polyamic acids, which can be converted into polyimides by heat treatment.

When adhesive varnish applied to the base film is subjected to heat treatment for the removal of solvents or for conversion into imide, polyamic acid varnish and polyimide varnish are treated at different temperatures. Polyamic acid varnish is preferably treated at a temperature not lower than the Tg of polyimides to perform the conversion into the polyimides, while polyimide varnish may be treated at any temperature sufficient to remove solvents.

After the adhesive layers are formed on the base film, it is preferable to conduct heat treatment at a temperature of 250° C. or higher for 1 to 30 minutes to improve the adhesion force between the adhesive layers and the base film.

The thickness of each adhesive layer formed on the base film is preferably 5 to 50 $\mu$m, more preferably 10 to 30 $\mu$m.

The lead frame of the present invention comprises a lead frame body and composite film applied to the lead frame body, the composite film being punched out from the composite film of the present invention.

The lead frame bodies may have any structure and, for example, comprise inner lead portions to be connected to a semiconductor chip, outer lead portions to be connected to external circuits, and the composite film of the present invention is applied to predetermined portions of the lead frame bodies.

The lead frames with composite film attached may be produced by bonding the composite film to lead frame bodies by punching the composite film onto the lead frame bodies. Semiconductor packages produced by using the lead frames with composite film attached are excellent in reliability.

For example, the bonding of the composite film to lead frames may be efficiently performed by placing the composite film over a lead frame body, with one adhesive layer facing the lead frame, punching the composite film into strips by using punching metal molds, which continuously press the punched out strips to predetermined portions of the underlying lead frame body at a pressure of 0.1 to 10 MPa for 0.1 to 5 seconds, to bond them by their adhesive layers. The forms of the punched out strips of the composite film vary, for example, depending on the forms of chips, the locations of pads on chips or the designs of lead frames. At the time of punching, the lead frame body is generally heated to a predetermined temperature, for example, 200 to 500° C. The composite film to be punched may also be heated. If flashes are formed around the punched strips, the flashes adhere to bonding areas of lead frames, to interfere wire bonding.

Hereinafter, the present invention will be described in detail referring to examples, but the scope of the invention is not limited by the examples.

EXAMPLE 1

Each side of a polyimide film (Trade name: UPILEX-S, produced by Ube Industries, Ltd., Tg>300° C., water absorption: 1.2% by weight, thermal expansion coefficient: $1.6 \times 10^{-5}/°$ C.) having an edge tearing strength of 35 kg/20 mm and a thickness of 25 $\mu$m was coated with a 17 $\mu$m thick layer of a polyamideimide adhesive (Trade name: HIMAL, produced by Hitachi Chemical Co., Ltd.) having a Tg of 185° C., a water absorption of 1.7% by weight and a broadening length of 0.05 mm, to produce a composite film of a total thickness of 59 $\mu$m.

The composite film was placed over a lead frame of 42 ally heated to 400° C., and was then punched by using punching metal molds to form punched out strips, which were then continuously pressed by the punching metal molds to leads of the underlying lead frame for one second at a pressure of 3 MPa, to give a lead frame with composite film attached. No flashes were observed by microscopic examination of the edges of the punched composite film.

COMPARATIVE EXAMPLE 1

A composite film was produced in the same manner as in Example 1 with the exception that a polyimide film (UPILEX-S) having an edge tearing strength of 25 kg/20 mm and a thickness of 25 $\mu$m was used.

A lead frame with composite film attached was produced in the same manner as in Example 1 with the exception that the composite film made as above was used in place of the composite film of Example 1. Flashes were observed by microscopic examination of the edges of the punched composite film.

EXAMPLE 2

Each side of a polyimide film (UPILEX-S) having an edge tearing strength of 30 kg/20 mm and a thickness of 50

μm was coated with a 25 μm thick layer of the same polyamideimide adhesive as that used in Example 1, to produce a composite film of a total thickness of 100 μm.

A lead frame with composite film attached was produced in the same manner as in Example 1 with the exception that the composite film made as above was used in place of the composite film of Example 1. No flashes were observed by microscopic examination of the edges of the punched composite film.

EXAMPLE 3

Each side of a polyimide film (UPILEX-S) having an edge tearing strength of 30 kg/20 mm and a thickness of 25 μm was coated with a 17 μm thick layer of a polyamideimide adhesive having a Tg of 225° C., a water absorption of 1.8% by weight and a broadening length of 2.0 mm, to produce a composite film of a total thickness of 59 μm.

A lead frame with composite film attached was produced in the same manner as in Example 1 with the exception that the composite film made as above was used in place of the composite film of Example 1. No flashes were observed by microscopic examination of the edges of the punched composite film.

EXAMPLE 4

Each side of a polyimide film (UPILEX-S) having an edge tearing strength of 35 kg/20 mm and a thickness of 50 μm was coated with a 25 μm thick layer of the same polyamideimide adhesive as that used in Example 3, to produce a composite film of a total thickness of 100 μm.

A lead frame with composite film attached was produced in the same manner as in Example 1 with the exception that the composite film made as above was used in place of the composite film of Example 1. No flashes were observed by microscopic examination of the edges of the punched composite film.

EXAMPLE 5

Each side of a polyimide film (UPILEX-S) having an edge tearing strength of 30 kg/20 mm and a thickness of 50 μm was coated with a 15 μm thick layer of the same polyamideimide adhesive as that used in Example 3, to produce a composite film of a total thickness of 80 μm.

A lead frame with composite film attached was produced in the same manner as in Example 1 with the exception that the composite film made as above was used in place of the composite film of Example 1. No flashes were observed by microscopic examination of the edges of the punched composite film.

COMPARATIVE EXAMPLE 2

Each side of a polyimide film (UPILEX-S) having an edge tearing strength of 25 kg/20 mm and a thickness of 25 μm was coated with a 20 μm thick layer of the same polyamideimide adhesive as that used in Example 1, to produce a composite film of a total thickness of 65 μm.

A lead frame with composite film attached was produced in the same manner as in Example 1 with the exception that the composite film made as above was used in place of the composite film of Example 1. A great many flashes were observed by microscopic examination of the edges of the punched composite film.

COMPARATIVE EXAMPLE 3

A composite film having a total thickness of 65 μm was produced in the same manner as in Comparative Example 2 with the exception that a polyimide film (UPILEX-S) having an edge tearing strength of 30 kg/20 mm and a thickness of 25 μm was used.

A lead frame with composite film attached was produced in the same manner as in Example 1 with the exception that the composite film made as above was used in place of the composite film of Example 1. Many flashes were observed by microscopic examination of the edges of the punched composite film.

EXAMPLE 6

Each side of a polyimide film (UPILEX-S) having an edge tearing strength of 25 kg/20 mm and a thickness of 25 μm was coated with a 12 μm thick layer of the same polyamideimide adhesive as that used in Example 1, to produce a composite film of a total thickness of 49 μm.

A lead frame with composite film attached was produced in the same manner as in Example 1 with the exception that the composite film made as above was used in place of the composite film of Example 1. No flashes were observed by microscopic examination of the edges of the punched composite film.

EXAMPLE 7

Each side of a polyimide film (UPILEX-S) having an edge tearing strength of 30 kg/20 mm and a thickness of 25 μm was coated with a 15 μm thick layer of the same polyamideimide adhesive as that used in Example 1, to produce a composite film of a total thickness of 55 μm.

A lead frame with composite film attached was produced in the same manner as in Example 1 with the exception that the composite film made as above was used in place of the composite film of Example 1. No flashes were observed by microscopic examination of the edges of the punched composite film.

COMPARATIVE EXAMPLE 4

A composite film having a total thickness of 55 μm was produced in the same manner as in Example 7 with the exception that a polyimide film (UPILEX-S) having an edge tearing strength of 20 kg/20 mm and a thickness of 25 μm was used.

A lead frame with composite film attached was produced in the same manner as in Example 1 with the exception that the composite film made as above was used in place of the composite film of Example 1. Flashes were observed by microscopic examination of the edges of the punched composite film.

The values of T, $R_x(0.6T\text{-}8)$ and A/B in the above-described Examples and Comparative Examples are shown in Table 1.

TABLE 1

|  | T (μm) | R (kg/20 mm) | 0.6T-8 | A (μm) | B (μm) | A/B (0.5–1.4) |
|---|---|---|---|---|---|---|
| Example 1 | 59 | 35 | 27.4 | 34 | 25 | 1.36 |
| Comp. Example 1 | 59 | 25 | 27.4 | 34 | 25 | 1.36 |
| Example 2 | 100 | 30 | 28 | 50 | 50 | 1.00 |
| Example 3 | 59 | 30 | 27.4 | 34 | 25 | 1.36 |
| Example 4 | 100 | 35 | 28 | 50 | 50 | 1.00 |
| Example 5 | 80 | 30 | 28 | 30 | 50 | 0.60 |
| Comp. Example 2 | 65 | 25 | 28 | 40 | 25 | 1.60 |

TABLE 1-continued

|  | T (μm) | R (kg/20 mm) | 0.6T-8 | A (μm) | B (μm) | A/B (0.5–1.4) |
|---|---|---|---|---|---|---|
| Comp. Example 3 | 65 | 30 | 28 | 40 | 25 | 1.60 |
| Example 6 | 49 | 25 | 21.4 | 24 | 25 | 0.96 |
| Example 7 | 55 | 30 | 25 | 30 | 25 | 1.36 |
| Comp. Example 4 | 55 | 20 | 25 | 30 | 25 | 1.36 |

As evident from the results as shown in Table 1, the composite film of the present invention has such an excellent punching capability that no flashes are formed at the punched edges, and by using lead frames with the composite film attached, extremely reliable semiconductor packages can be produced.

What is claimed is:

1. A method of producing a lead frame with a composite film attached, comprising steps of:
    placing a composite film over a lead frame, the composite film including a base film and an adhesive layer on at least one side of the base film, such that the composite film has the at least one adhesive layer, the composite film having a thickness of T ($\mu$m), the base film having an edge tearing strength of R (kg/20 mm), the at least one adhesive layer having a total thickness of A, and the base film having a thickness of B, T being related to R by a numerical formula R>0.6T-8 when T≦60, or by a numerical formula R≧28 when T>60, and A/B being 0.5 to 1.4, with one adhesive layer facing the lead frame, wherein the at least one adhesive layer is made of an adhesive having a broadening length of 2 mm or less;
    punching the composite film into a strip by using a punching metal mold; and
    pressing the strip to the lead frame with the punching metal mold at a pressure of 0.1 to 10 MPa for 0.1 to 5 seconds.

2. The method of claim 1, wherein the lead frame is heated to 200° to 500° C. during said punching.

3. The method of claim 1, wherein the adhesive layer is made of an adhesive having a glass transition temperature of 150° to 350° C. and a water absorption of 3% or less.

4. The method of claim 3, wherein the base film is made of a material having a glass transition temperature higher than that of said adhesive, and having a water absorption of 3% or less.

5. The method of claim 4, wherein the adhesive is a polyimide adhesive or a polyamide adhesive.

6. The method of claim 4, wherein the base film is a heat resistant film made of a resin selected from the group consisting of polyimide, polyamide, polysulfone, polyphenylenesulfide, polyetheretherketone and polyarylate.

7. The method of claim 4, wherein each side of the base film is coated with the adhesive layer, and the thickness A is the total thickness of the adhesive layers.

8. The method of claim 4, wherein the base film has a thickness of 5 to 150 μm, and each adhesive layer has a thickness of 5 to 50 μm.

9. The method of claim 4, wherein the glass transition temperature of the base film is at least 200° C.

10. The method of claim 1, wherein the broadening length is 0.5 mm or less.

11. The method of claim 1, wherein the base film has a thickness of 20 to 125 μm, and each adhesive layer has a thickness of 10 to 30 μm.

12. The method of claim 1, wherein R is 25 to 35.

13. The method of claim 1, wherein T is related to R by a numerical formula 35≧R>0.6T-8 when T≦60, or by a numerical formula 35≧R≧28 when T>60.

14. A The method of claim 1, wherein T≦60.

15. A method of bonding a semiconductor chip to a lead frame, comprising steps of:
    punching a composite film to punch out a strip of the composite film, the composite film including a base film and an adhesive layer on each side of the base film, the composite film having a thickness of T ($\mu$m), the base film having an edge tearing strength of R (kg/20 mm), the adhesive layer having a total thickness of A, and the base film having a thickness of B, T being related to R by a numerical formula R>0.6T-8 when T≦60, or by a numerical formula R≧28 when T>60, and A/B being 0.5 to 1.4, and wherein the adhesive layer is made of an adhesive having a broadening length of 2 mm or less;
    applying the strip to the lead frame by pressing the strip so that one adhesive layer of the strip contacts the lead frame; and
    bonding a semiconductor chip onto another adhesive layer of the strip.

16. The method of claim 15, wherein the composite film is placed over the lead frame, with one adhesive layer facing the lead frame body, and punched with a punching metal mold to punch out the strip of the composite film, and the strip is pressed to the lead frame with the punching metal mold at a pressure of 0.1 to 10 MPa for 0.1 to 5 seconds.

17. The method of claim 15, wherein the lead frame is heated to 200° to 500° C. during said punching.

18. The method of claim 15, wherein the adhesive layer is made of an adhesive having a glass transition temperature of 150° to 350° C. and a water absorption of 3% or less.

19. The method of claim 15, wherein the base film is made of a material having a glass transition temperature higher than that of said adhesive, and having a water absorption of 3% or less.

20. The method of claim 15, wherein the adhesive is a polyimide adhesive or a polyamide adhesive.

21. The method of claim 15, wherein the base film is a heat resistant film made of a resin selected from the group consisting of polyimide, polyamide, polysulfone, polyphenylenesulfide, polyetheretherketone and polyarylate.

22. The method of claim 15, wherein the base film has a thickness of 5 to 150 μm, and each adhesive layer has a thickness of 5 to 50 μm.

23. The method of claim 15, wherein the glass transition temperature of the base film is at least 200° C.

24. The method of claim 15, wherein R is 25 to 35.

25. The method of claim 15, wherein T is related to R by a numerical formula 35≧R>0.6T-8 when T≦60, or by a numerical formula 35≧R>28 when T>60.

26. The method of claim 15, wherein T≦60.

27. A composite film, comprising a base film and at least one adhesive layer on at least one side of the base film, the composite film having a thickness of T ($\mu$m), the base film having an edge tearing strength of R (kg/20 mm), the at least one adhesive layer having a total thickness of A, the base film having a thickness of B, T being related to R by a numerical formula R>0.6T-8 when T≦60 or by a numerical formula R≧28 when T>60, and A/B being 0.5 to 1.4, wherein the at least one adhesive layer is made of an adhesive having a broadening length of 2 mm or less.

28. The composite film of claim 27, wherein T is related to R by a numerical formula 35≧R>R0.6T-8 when T≦60, or by a numerical formula 35R>28 when T>60.

29. The composite film of claim 27, wherein $T \leq 60$.

30. A semiconductor package containing the composite film of claim 27 as a bonding element.

31. The semiconductor package of claim 30, wherein T is related to R by a numerical formula $35 \geq R > 0.6T-8$ when $T \leq 60$, or by a numerical formula $35 \leq R > 28$ when $T > 60$.

32. The semiconductor package of claim 30, wherein $T \leq 60$.

33. A lead frame with a composite film attached, comprising a lead frame body and a strip of a composite film applied to the lead frame body, wherein the strip is punched out from the composite film, the composite film comprising a base film and at least one adhesive layer on at least one side of the base film, the composite film having a thickness of T ($\mu$m), the base film having an edge tearing strength of R (kg/20 mm), the at least one adhesive layer having a total thickness of A, the base film having a thickness of B, T being related to R by a numerical formula $R > 0.6T-8$ when $T \leq 60$ or by a numerical formula $R \geq 28$ when $T > 60$, and A/B being 0.5 to 1.4, wherein the at least one adhesive layer is made of an adhesive having a broadening length of 2 mm or less.

34. The lead frame with a composite film attached of claim 33, wherein the lead frame body and the composite film are bonded to each other by one adhesive layer of the composite film.

35. The lead frame with a composite film attached of claim 33, wherein T is related to R by a numerical formula $35 \geq R > 0.6T-8$ when $T \leq 60$, or by a numerical formula $35 \geq R > 28$ when $T > 60$.

36. The lead frame with a composite film attached of claim 33, wherein $T \leq 60$.

37. A semiconductor package containing the lead frame of claim 33.

38. The semiconductor package of claim 37, wherein the lead frame body is bonded to a chip by the strip of the composite film applied to the lead frame body.

39. The semiconductor package of claim 38, wherein the lead frame body is bonded to a heat spreader by the strip of the composite film applied to the lead frame body.

40. A composite film, comprising a base film and a least one adhesive layer on at least one side of the base film, the composite film having a thickness of T ($\mu$m), the base film having an edge tearing strength of R (kg/20 mm), the at least one adhesive layer having a total thickness of A, the base film having a thickness of B, T being related to R by a numerical formula $R > 0.6T-8$ when $T \leq 60$, or by a numerical formula $R \geq 28$ when $T > 60$, and A/B being 0.5 to 1.4, wherein the at least one adhesive layer is made of an adhesive having a broadening length of 2 mm or less, and wherein the composite film has a property that flashings can be prevented when punching out a portion of the composite film.

\* \* \* \* \*